(12) United States Patent
Rose et al.

(10) Patent No.: US 11,621,175 B1
(45) Date of Patent: Apr. 4, 2023

(54) METHOD AND APPARATUS FOR REMOVING PARTICLES FROM THE SURFACE OF A SEMICONDUCTOR WAFER

(71) Applicant: NCC NANO, LLC, Dallas, TX (US)

(72) Inventors: David Alex Rose, Seoul (KR); Kurt A. Schroder, Coupland, TX (US)

(73) Assignee: PulseForge Inc., Austin, TX (US)

( * ) Notice: Subject to any disclaimer, the term of this patent is extended or adjusted under 35 U.S.C. 154(b) by 0 days.

(21) Appl. No.: 17/541,953

(22) Filed: Dec. 3, 2021

(51) Int. Cl.
*H01L 21/67* (2006.01)
*B08B 7/00* (2006.01)

(52) U.S. Cl.
CPC ........ *H01L 21/6704* (2013.01); *B08B 7/0035* (2013.01)

(58) Field of Classification Search
None
See application file for complete search history.

(56) References Cited

U.S. PATENT DOCUMENTS

| | | | |
|---|---|---|---|
| 2006/0060213 A1* | 3/2006 | Huber | B08B 7/0042 134/2 |
| 2006/0156785 A1* | 7/2006 | Mankame | B25B 5/163 72/413 |
| 2016/0339448 A1* | 11/2016 | Dash | G01R 21/00 |
| 2020/0346242 A1* | 11/2020 | Gillessen | B64F 5/40 |

OTHER PUBLICATIONS

W. Zapka, et al., Laser Cleaning of Wafer Surfaces and Lithography Masks, Microelectronic Engineering 13 (1991) 547-550.
J. Graf, Laser cleaning of particles from silicon wafers: capabilities and mechanisms, First publ. in: Solid State Phenomena 103-104 (2005), pp. 185-188.

* cited by examiner

*Primary Examiner* — Nicole Blan
(74) *Attorney, Agent, or Firm* — Antony P. Ng; Russell Ng PLLC

(57) ABSTRACT

A method for removing particles from a semiconductor wafer surface is disclosed. A wafer is being spun on a spin coater contained within a condensing environment. Liquid vapor is then infused into the condensing environment to allow some of the liquid vapor to be condensed onto a surface of the wafer on which particles may adhere while the wafer is being spun. Next, a set of light pulses is applied to the surface of the spinning wafer. Finally, an electric grid is utilized to remove the particles off the surface of the wafer.

4 Claims, 7 Drawing Sheets

METHOD AND APPARATUS FOR REMOVING PARTICLES FROM THE SURFACE OF A SEMICONDUCTOR WAFER

RELATED PATENT APPLICATION

The present patent application is related to co-pending applications:
U.S. Ser. No. 17/541,877, filed on even date; and
U.S. Ser. No. 17/541,925, filed on even date.

TECHNICAL FIELD

The present application relates to method and apparatus for processing integrated circuits in general, and, in particular, to a method and apparatus for removing particles from the surface of a semiconductor wafer.

BACKGROUND

One of the main sources of defects in electronic devices is particle contamination on the surface of a wafer or panel during fabrication of electronic devices on a semiconductor wafer. There are many origins of the particles. Some are from previous processes and some are introduced from external sources.

Much of the cost of building a clean room is centered around reducing the number of airborne particles within the clean room. Despite all the efforts to keep particles out of the clean room, particles are still able to make their way onto the surface of wafers during device manufacturing. Regardless of their origin, it is imperative to remove particles as they interfere with device fabrication and contribute to defects in the electronic devices. Hence, most of the processes in semiconductor manufacturing are relating to cleaning.

Different methods can be utilized to remove particles already settled on a wafer surface, depending on the particle composition, size, adhesiveness, etc. For example, large particles that are poorly adhered to a wafer surface can be removed by a jet of air. Mechanical means, such as wiping with a cloth, may sometimes be utilized. Non-contact techniques, such as solvents, may be employed when the surfaces to be cleaned are too easily to be scratched. Reactive solvents, such as piranha etch or RCA process, can also be utilized to dissolve particles. They are particularly useful when the particles are of an organic nature. The wet techniques can be enhanced by the usage of ultrasonic cleaning. In contrast, dry, non-contact methods of particle removal may include plasma treatment, ultraviolet ozone, etc.

Despite a plethora of methods employed to remove particles from wafer surfaces, particle removal continues to be a problem. Particle removal becomes even more important as the feature size of electronic devices decreases while the number of steps in the fabrication process increases. Very tiny particles have always been present in various stages of the manufacturing process, but their removal was far less important than when the devices were larger. As particles become smaller, their surface area to mass ratio increases. This means that the adhesive force per particle mass of the particle to the surface increases. This, combined with the fact that the particle is smaller, means the shear force necessary to dislodge the particle from a surface increases. Simultaneously, structures on the surface in the presence of the particles are more easily damaged as they become smaller. So, it is a two-pronged problem in that traditional techniques for removing small particles from a wafer surface are not only inadequate but they can also damage devices on the wafer surface as well. Additionally, many particle removal technologies produce by-products that are environmentally unfriendly. Thus, it would be desirable to have little or no by-products from the particle cleaning process.

The present disclosure provides an improved method and apparatus for removing particles from the surface of a semiconductor wafer.

SUMMARY OF THE INVENTION

In accordance with one embodiment, a wafer is being spun on a spin coater contained within a condensing environment. Liquid vapor is then infused into the condensing environment to allow some of the liquid vapor to be condensed onto a surface of the wafer on which particles may adhere while the wafer is being spun. Next, a set of light pulses is applied to the surface of the spinning wafer. Finally, an electric grid is utilized to remove the particles off the surface of the wafer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The reason small particles are particularly difficult to remove from a surface is because of two effects. First, the surface area to mass ratio of a particle increases as the particle becomes smaller, which means that if the particle is in contact with a surface, such as a wafer surface, the adhesion per unit length becomes larger. Second, it is very difficult to achieve any significant shear on the spatial scale of a tiny particle when attempting to apply a shear force to remove the particle. Thus, many techniques of removing particles from a surface are less effective for very small particles.

Three improved methods for removing small particles from the surface of a semiconductor wafer are described, as follows.

First Method

Figure 1:
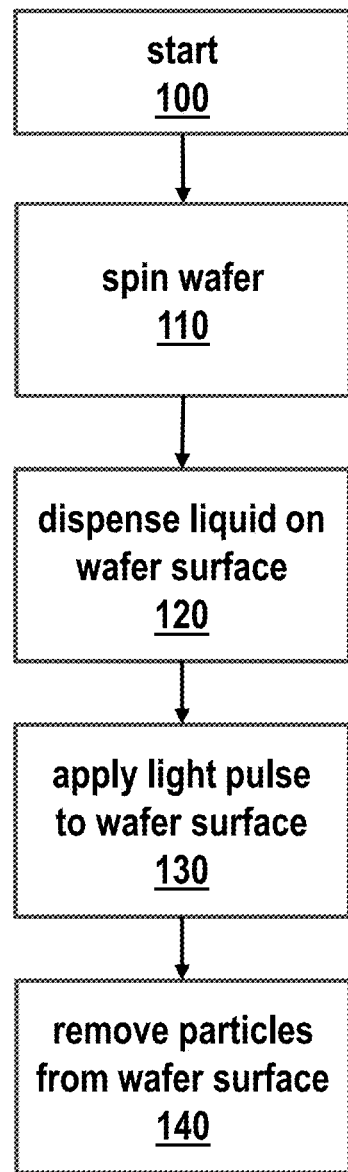
FIG. 1 is a flow diagram of a method for removing particles from the surface of a wafer, according to a first embodiment.

Referring now to the drawings and in particular to FIG. 1, there is depicted a flow diagram of a method for removing particles from the surface of a semiconductor wafer, such as a silicon wafer, according to a first embodiment. Starting at block 100, a wafer is being spun on a spin coater, as shown in block 110. Next, a small stream of liquid is continuously dispensed (puddle dispense) onto a surface of the wafer to which particles may adhere while the wafer is being spun, as depicted in block 120. Preferably, the liquid is dispensed near the center of the wafer surface. The liquid flows tangentially over the wafer surface due to the friction of the liquid with the spinning wafer, and the liquid also flows radially outward over the wafer surface due to centrifugal force.

Next, light pulses are repeatedly emitted onto the surface of the wafer over liquid while liquid is being dispensed on the spinning wafer, as shown in block 130. After the light pulse emissions, particles previously attached to the wafer surface can be easily removed from the wafer surface along with the flowing liquid, as depicted in block 140.

The liquid may be an inorganic solvent, such as water, or an organic solvent, such as alcohol. The liquid may contain chemicals, such as acids or detergents, to aid in the wetting of the liquid flowing over the wafer. The liquid is important to this method for two reasons, namely, a source of gas bubbles generated by the heating of a particle by light pulses, and acts as a heat sink to prevent the wafer surface from heat damage. The boiling point and heat of vaporization of the liquid are among the variables that determine at what point in time the gas bubble is generated due to heating by the pulse of light.

Figure 2:
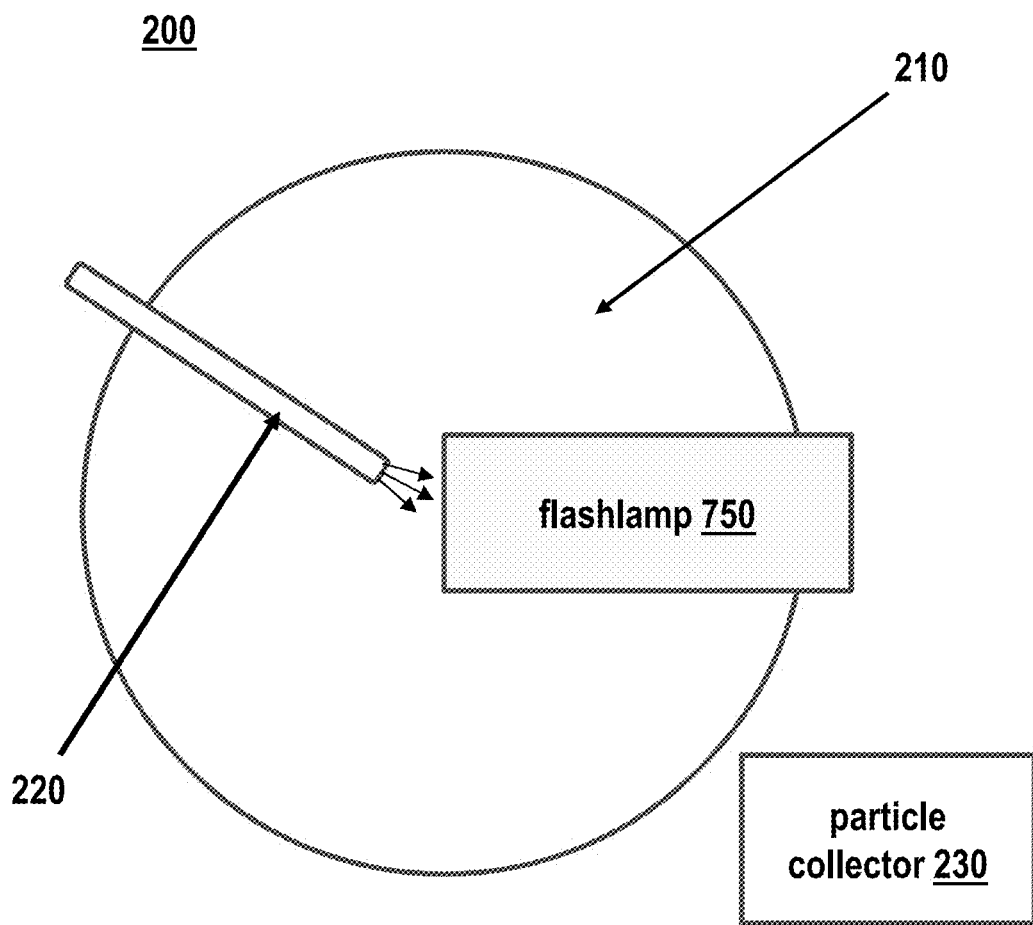
FIG. 2 is a diagram of an apparatus for removing particles from the surface of a wafer, according to the method shown in FIG. 1.

With reference now to FIG. 2, there is depicted a diagram of an apparatus for removing particles from the surface of a semiconductor wafer, such as a silicon wafer, according to the method shown in FIG. 1. As shown, an apparatus 200 includes a spin coater 210, a liquid dispenser 220, a particle collector 230, and a flashlamp 750.

Spin coater 210 includes a vacuum chuck to hold down the wafer. An adhesive or a retaining device can also be utilized to secure a wafer onto spin coater 210. Initially, the angular position of the wafer on spin coater 210 is obtained via an encoder, and recorded. The encoder can be optical, magnetic, or mechanical. The angular position of the wafer is then sent to a flashlamp controller of flashlamp 750, and the pulsing of the light is synchronized to the spin rate of the wafer such that the entire wafer may be uniformly exposed with a specified average number of pulses.

Specifically, the angular position of the spin coater is known with a rotary encoder, such as an optical rotary encoder. Since the source of light covers only a portion of the wafer, multiple pulses of light are needed to cover the entire wafer. Thus, in order to guarantee full coverage of a minimum number of pulses over the entire wafer, flashlamp 750 must pulse at specified angular positions of the wafer. Thus, the rotary position of the wafer is used to trigger the flashlamp controller, which send a firing signal to flashlamp 750 to flash the flashlamp. However, as the wafer may be spinning at several thousand revolution per minute (rpm), the time it takes for the wafer to spin to subsequent rotary firing positions may be too short in duration for the capacitors within flashlamp 750 to fully recharge to fire at the same intensity. Thus, the wafer may need to complete multiple revolutions before flashlamp 750 firing at each subsequent position on the wafer. So, in order to uniformly expose the rapidly spinning wafer, the rotary position for each firing of flashlamp 750 must be calculated, and additionally, the end of charge must be complete before flashlamp 750 can fire. For example, if the wafer is being spun at 2,400 rpm, the time for a single revolution is 25 ms. If 6 pulses are needed to fully cover the entire wafer, then subsequent firings at each rotary location would need to be performed every 4.2 ms. If an average of 4 pulses were needed on the wafer, then the firing rate would need to be about every 1 ms (or about 1 kHz). If the amount of energy discharged in each pulse is about 200 J, then the charging power supply for the capacitors would need to be at least 200 J/1 ms or 200 KW. This level of power is not only impractical, but allowing the wafer to revolve more than once between flashes allows one to source a practical power supply for the application.

The fluid dispensing from liquid dispenser 220 may be metered with a constant displacement pump, such as a peristaltic pump or may be controlled with a mass flow controller and be switched on and off with a solenoid.

Light pulses are provided by flashlamp 750. The light pulses can locally heat a particle if the radiant power is high enough to overcome the heat transfer from the particle to the surrounding liquid during irradiation. If the heating rate is high enough, and the particle is small (less than 100 nm) and somewhat absorptive of the light pulses, it is possible to heat the particle to a point that the particle will become hot enough to vaporize the liquid adjacent to it. The absorption of the light may also be at the surface of the wafer. If the particle is adjacent to a wafer surface, or even another particle, the vaporization will preferentially initiate, or nucleate, in the gap between the particle and the wafer surface. As a result, a gas bubble is rapidly formed in this gap, and an associated increase in local pressure at that site is formed. This has the effect of lifting the particle off the wafer surface. After the particle is no longer being heated by the light, the bubble collapses, and if the particle were not lifted from the surface of the wafer by the expansion of the gas bubble, the collapse of the gas bubble causes an increase in local pressure between the particle and the wafer surface to lift the particle off the wafer surface, and the particle becomes suspended in the liquid. Consequently, if the liquid is flowed transverse to the surface, e.g., across the wafer surface, during irradiation, the released particle can be swept away by the liquid flow.

Instead of using flashlamp 750, light pulses may also be provided by a laser (not shown). As shown, the flashlamp exposure area is at least half the diameter of the wafer. This means that it does not need to be scanned in the radial direction to expose the entire wafer when it is spinning. A laser beam size is generally smaller and is scanned in the radial direction while pulsing as the wafer is spinning to expose the entire wafer with a specified average number of pulses. Thus, in addition to the rotary encoder and method of uniformly exposing the wafer to the beam described above, the radial position of the laser must be known as well. The position of the laser can be determined by a variety of technologies such as a servo, a linear encoder, a rheostat, etc. At the beginning of processing, the laser begins preferably near the center of the wafer while it is spinning and scans out radially while the wafer is spinning and it is pulsing. At each radial position of the laser, the laser pulses with the rotary encoding scheme as the flashlamp then steps to the next radial position and repeats until the wafer is reached and the final annulus is processed. The number of laser pulses needed to uniformly cover the annulus increases must be calculated as the radial position increases, the length of the annulus increases linearly with the radial position. So, if firing at the maximum firing rate of the laser, the radial scan rate decreases linearly as the laser is indexed outward.

After the completion of light exposure and fluid dispensing has ceased, a flow of dry gas may be directed to the wafer, preferably near the center of the wafer to dry it before the removal of the wafer from spin coater 210. The wafer may still be spinning during gas dispense to encourage flow of the gas along the wafer. The gas may additionally be heated to encourage evaporation of any vapor which may still be on the wafer after processing and to discourage any condensation of new vapor on the wafer. The wafer may additionally be heated by operating flashlamp 750 at a low power either in continuous or pulsed mode.

The rotational speed of spin coater 210 as well as the metering rate of the flowing liquid can be controlled by using a specific ramp-up and ramp-down profile.

Second Method

The second method is similar to the first method except that liquid is being introduced in a vapor phase, and may be in a condensing environment.

Figure 3:
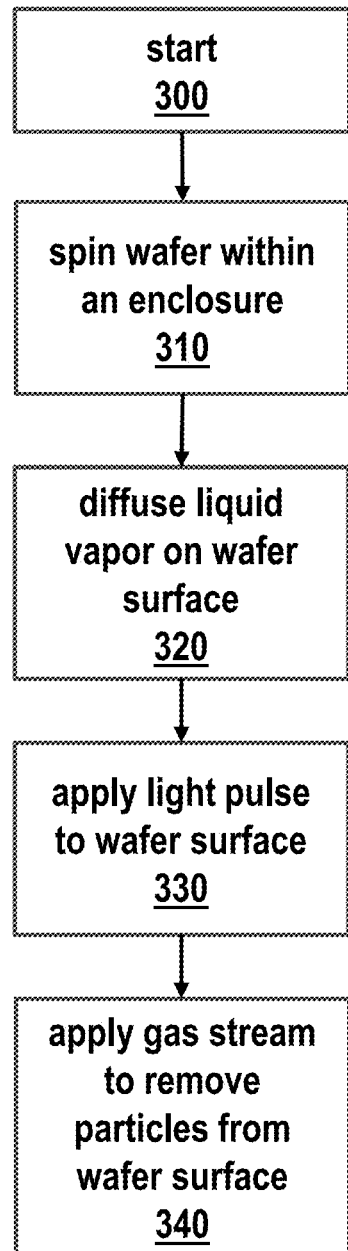
FIG. 3 is a flow diagram of a method for removing particles from the surface of a wafer, according to a second embodiment.

Referring now to FIG. 3, there is depicted a flow diagram of a method for removing particles from the surface of a semiconductor wafer, such as a silicon wafer, according to a second embodiment. Starting at block 300, a wafer is being spun on a spin coater within an enclosure having a controlled (condensing) atmosphere, as shown in block 310. The wafer may be slightly cooled with respect to the rest of the environment within the enclosure. Next, a small amount of liquid in a vapor phase is diffused into the enclosure in which the wafer is being spun, as depicted in block 320, such that some liquid will condense at a gap between the particle and the surface of the wafer.

In the case in which neither the particle nor the surface is particularly absorptive of the beam, an absorptive liquid may be used. An example of a liquid which absorbs some of the emission from a flashlamp is acetone. The absorptive liquid is introduced in a vapor phase within the condensing environment.

Light pulses are repeatedly illuminated onto the surface of the wafer within the enclosure while liquid is being condensed on the spinning wafer, as shown in block 330. When irradiated by light pulses, the liquid in the gap is vaporized and the particle is lifted from the surface of the wafer. While the light is pulsing, a gas stream, preferably directed near the center of the wafer and with flow parallel to the wafer surface may be utilized to sweep the particles off the wafer surface, as depicted in block 340. The gas stream, containing the particles may be exhausted. Alternatively, a filter may be placed in the gas stream to collect the particles and to allow for recycling of the gas in the controlled atmosphere.

Figure 4:
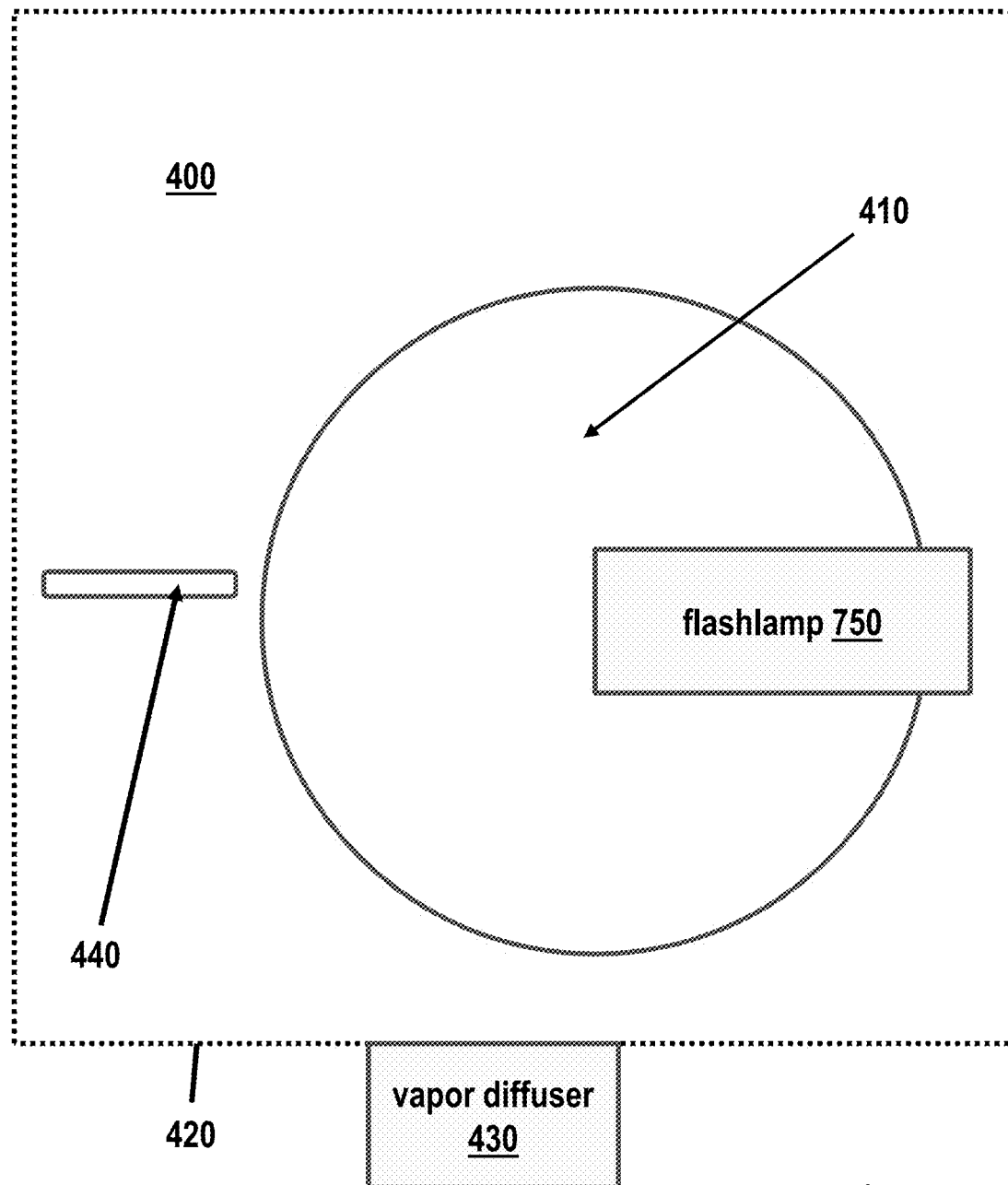
FIG. 4 is a diagram of an apparatus for removing particles from the surface of a wafer, according to the method shown in FIG. 3.

With reference now to FIG. 4, there is depicted a diagram of an apparatus for removing particles from the surface of a semiconductor wafer, according to the method shown in FIG. 3. As shown, an apparatus 400 includes a spin coater 410, an enclosure 420 in which atmosphere can be controlled, a vapor diffuser 430, an air blower 440, and flashlamp 750.

Spin coater 410 includes a vacuum chuck to hold down the wafer. An adhesive or a retaining device can also be utilized to secure a wafer onto spin coater 410. Initially, the angular position of the wafer on spin coater 410 is obtained via an encoder, and recorded. The encoder can be optical, magnetic, or mechanical. The angular position of the wafer is then sent to a flashlamp controller of flashlamp 750, and the pulsing of the light is synchronized to the spin rate of the wafer such that the entire wafer may be uniformly exposed with a specified average number of pulses.

Specifically, the angular position of the spin coater is known with a rotary encoder, such as an optical rotary encoder. Since the source of light covers only a portion of the wafer, multiple pulses of light are needed to cover the entire wafer. Thus, in order to guarantee full coverage of a minimum number of pulses over the entire wafer, flashlamp 750 must pulse at specified angular positions of the wafer. Thus, the rotary position of the wafer is used to trigger the flashlamp controller, which send a firing signal to flashlamp 750 to flash the flashlamp. However, as the wafer may be spinning at several thousand rpm, the time it takes for the wafer to spin to subsequent rotary firing positions may be too short in duration for the capacitors within flashlamp 750 to fully recharge to fire at the same intensity. Thus, the wafer may need to complete multiple revolutions before flashlamp 750 firing at each subsequent position on the wafer. So, in order to uniformly expose the rapidly spinning wafer, the rotary position for each firing of flashlamp 750 must be calculated, and additionally, the end of charge must be complete before flashlamp 750 can fire.

Instead of using flashlamp 750, light pulses may also be provided by a laser (not shown). As shown, the flashlamp exposure area is at least half the diameter of the wafer. This means that it does not need to be scanned in the radial direction to expose the entire wafer when it is spinning. A laser beam size is generally smaller and is scanned in the radial direction while pulsing as the wafer is spinning to expose the entire wafer with a specified average number of pulses. Thus, in addition to the rotary encoder and method of uniformly exposing the wafer to the beam described above, the radial position of the laser must be known as well. The position of the laser can be determined by a variety of technologies such as a servo, a linear encoder, a rheostat, etc. At the beginning of processing, the laser begins preferably near the center of the wafer while it is spinning and scans out radially while the wafer is spinning and it is pulsing. At each radial position of the laser, the laser pulses with the rotary encoding scheme as the flashlamp then steps to the next radial position and repeats until the wafer is reached and the final annulus is processed. The number of laser pulses needed to uniformly cover the annulus increases must be calculated as the radial position increases, the length of the annulus increases linearly with the radial position. So, if firing as the maximum firing rate of the laser, the radial scan rate decreases linearly as the laser is indexed outward.

Third Method

The third method is similar to the second method except that a different equipment is utilized to remove the loosened particles in a condensing environment.

Figure 5:
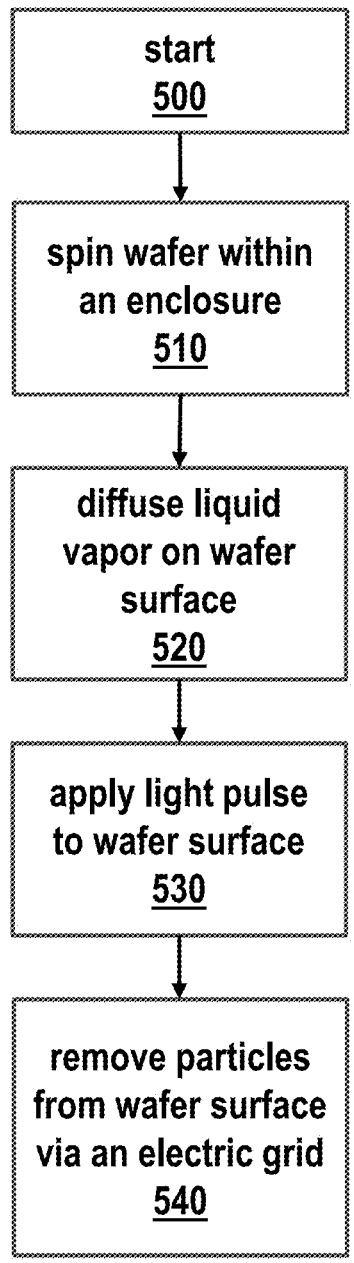
FIG. 5 is a flow diagram of a method for removing particles from the surface of a wafer, according to a third embodiment.

Referring now to FIG. 5, there is depicted a flow diagram of a method for removing particles from the surface of a semiconductor wafer, such as a silicon wafer, according to a third embodiment. Starting at block 500, a wafer is being spun on a spin coater within an enclosure having a controlled (condensing) atmosphere, as shown in block 510. The wafer may be slightly cooled with respect to the rest of the environment within the enclosure. Next, a small amount of liquid in a vapor phase is diffused into the enclosure in which the wafer is being spun, as depicted in block 520, such that some liquid will condense at a gap between the particle and the surface of the wafer.

In the case in which neither the particle nor the surface is particularly absorptive of the beam, an absorptive liquid such as acetone may be used. The absorptive liquid is introduced in a vapor phase within the condensing environment.

Light pulses are repeatedly illuminated onto the surface of the wafer within the enclosure while liquid is being condensed on the spinning wafer, as shown in block 530. When irradiated by light pulses, the liquid in the gap is vaporized and the particle is lifted from the surface of the wafer. After the particle has been lifted, it is accelerated off the wafer surface by an electric grid, as depicted in block 540. The electric grid may be annular and positioned outside of the wafer so as to not physically block any of the light from the light source. The electric grid may be energized during application of the pulsed light.

Figure 6:
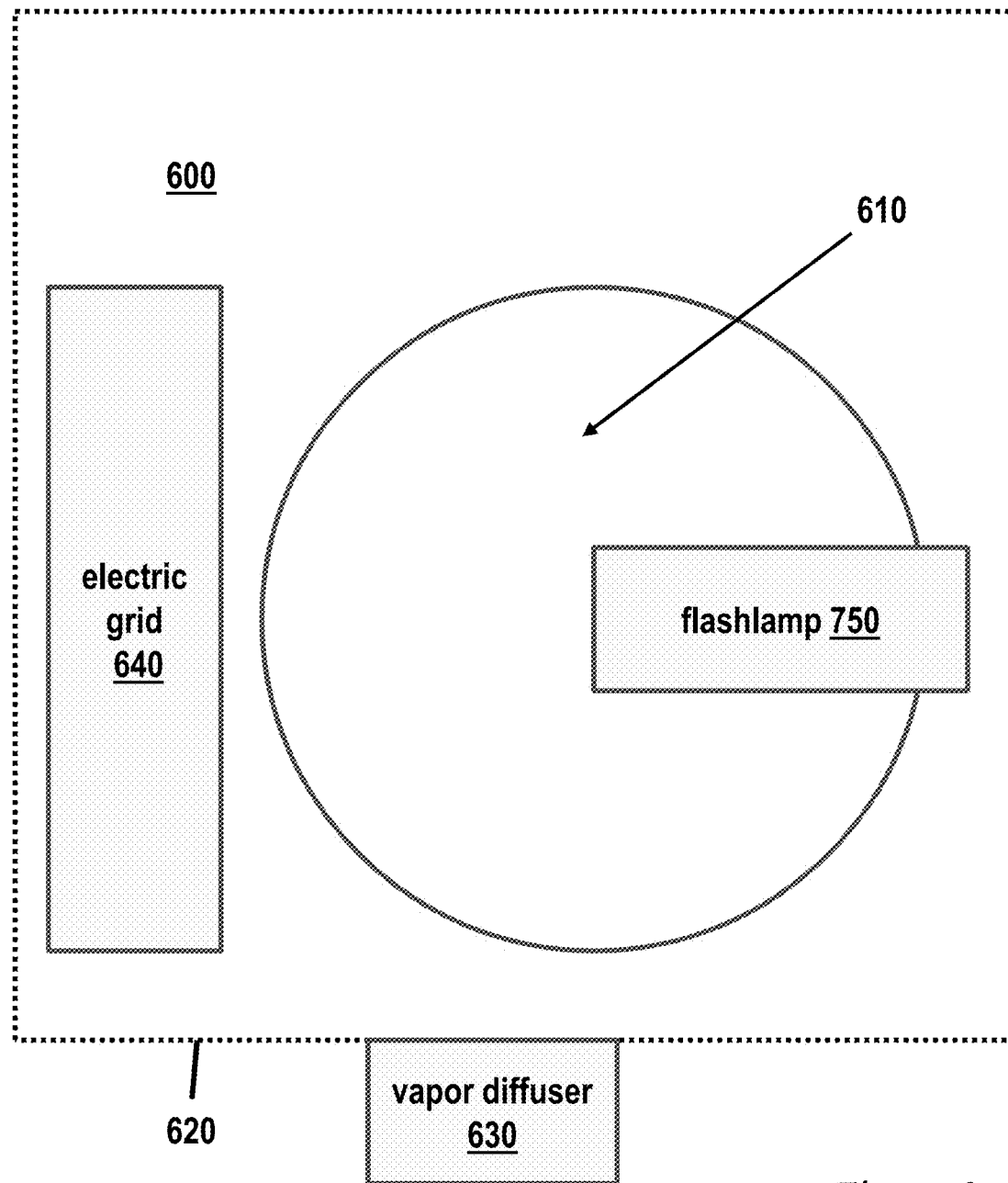
FIG. 6 is a diagram of an apparatus for removing particles from the surface of a wafer, according to the method shown in FIG. 5.

With reference now to FIG. 6, there is depicted a diagram of an apparatus for removing particles from the surface of a semiconductor wafer, according to the method shown in FIG. 5. As shown, an apparatus 600 includes a spin coater 610, an enclosure 620 in which atmosphere can be controlled, a vapor diffuser 630, an electric grid 640, and flashlamp 750. Electric grid 640 provides an electric potential between a wafer and electric grid 640 to accelerate particles to electric grid 640 after particles have been dislodged from the wafer surface. The wafer may be biased at one voltage, and electric grid 640 may be positioned off the side of the wafer and out of the beam from flashlamp 750.

Spin coater 610 includes a vacuum chuck to hold down the wafer. An adhesive or a retaining device can also be utilized to secure a wafer onto spin coater 610. Initially, the angular position of the wafer on spin coater 610 is obtained via an encoder, and recorded. The encoder can be optical, magnetic, or mechanical. The angular position of the wafer is then sent to a flashlamp controller of flashlamp 750, and the pulsing of the light is synchronized to the spin rate of the wafer such that the entire wafer may be uniformly exposed with a specified average number of pulses.

Specifically, the angular position of the spin coater is known with a rotary encoder, such as an optical rotary encoder. Since the source of light covers only a portion of the wafer, multiple pulses of light are needed to cover the entire wafer. Thus, in order to guarantee full coverage of a minimum number of pulses over the entire wafer, flashlamp 750 must pulse at specified angular positions of the wafer. Thus, the rotary position of the wafer is used to trigger the flashlamp controller, which send a firing signal to flashlamp 750 to flash the flashlamp. However, as the wafer may be spinning at several thousand rpm, the time it takes for the wafer to spin to subsequent rotary firing positions may be too short in duration for the capacitors within flashlamp 750 to fully recharge to fire at the same intensity. Thus, the wafer may need to complete multiple revolutions before flashlamp 750 firing at each subsequent position on the wafer. So, in order to uniformly expose the rapidly spinning wafer, the rotary position for each firing of flashlamp 750 must be calculated, and additionally, the end of charge must be complete before flashlamp 750 can fire.

Instead of using flashlamp 750, light pulses may also be provided by a laser (not shown). As shown, the flashlamp exposure area is at least half the diameter of the wafer. This means that it does not need to be scanned in the radial direction to expose the entire wafer when it is spinning. A laser beam size is generally smaller and is scanned in the radial direction while pulsing as the wafer is spinning to expose the entire wafer with a specified average number of pulses. Thus, in addition to the rotary encoder and method of uniformly exposing the wafer to the beam described above, the radial position of the laser must be known as well. The position of the laser can be determined by a variety of technologies such as a servo, a linear encoder, a rheostat, etc. At the beginning of processing, the laser begins preferably near the center of the wafer while it is spinning and scans out radially while the wafer is spinning and it is pulsing. At each radial position of the laser, the laser pulses with the rotary encoding scheme as the flashlamp then steps to the next radial position and repeats until the wafer is reached and the final annulus is processed. The number of laser pulses needed to uniformly cover the annulus increases must be calculated as the radial position increases, the length of the annulus increases linearly with the radial position. So, if firing as the maximum firing rate of the laser, the radial scan rate decreases linearly as the laser is indexed outward.

Electric grid 640 may also be disposed between flashlamp 750 and a wafer. Hence, the flashlamp beam shines through electric grid 640. This method for removing particles essentially forms an electrostatic precipitator.

Figure 7:
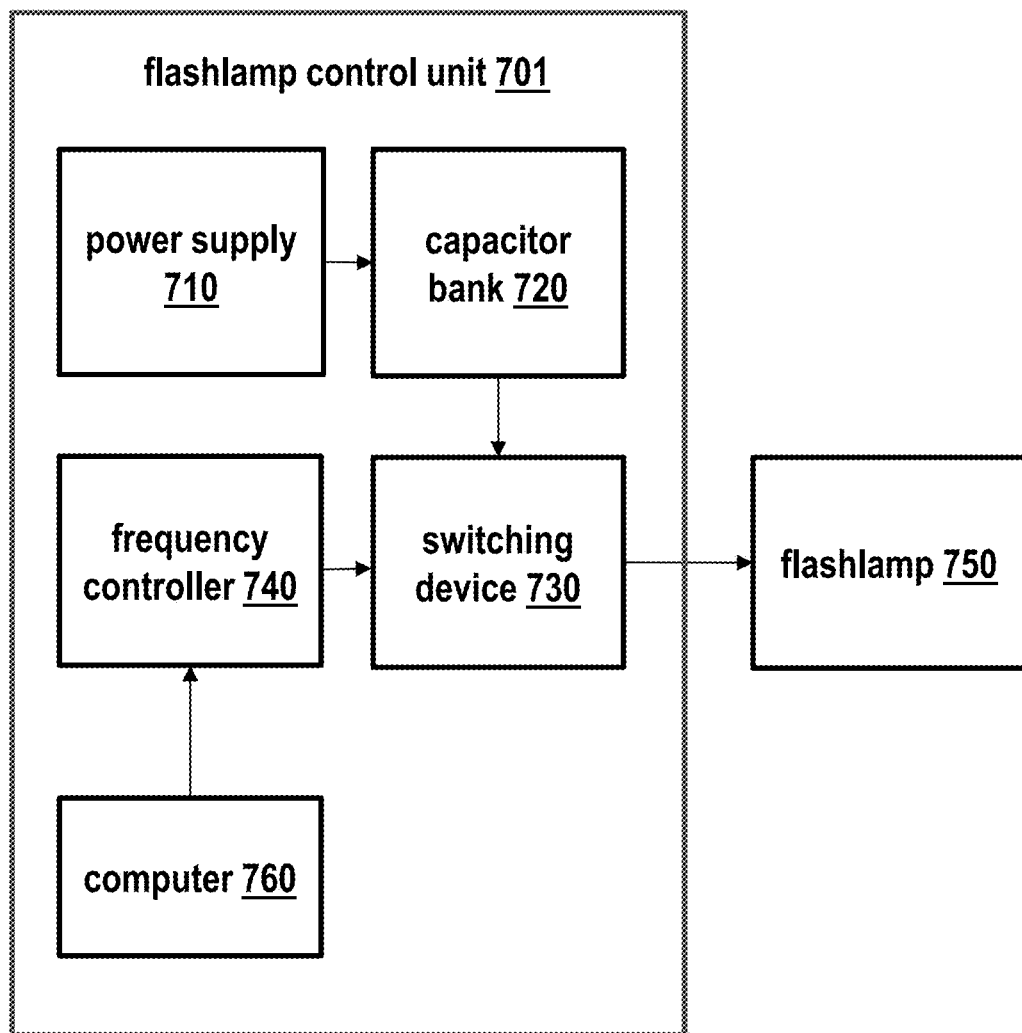
FIG. 7 is a block diagram of a flashlamp control unit for controlling a flashlamp within the apparatus from FIGS. 2, 4 and 6, according to one embodiment.

Referring now to FIG. 7, there is depicted a block diagram of a flashlamp control unit for controlling flashlamp 750, according to one embodiment. As shown, a flashlamp control unit 701 includes a capacitor-bank-charging power supply 710, a capacitor bank 720, an insulated gate barrier transistor (IGBT)-based switching device 730, a frequency controller 740, and a computer 760. Computer 760 includes a processor and various storage devices that are well-known to those skilled in the art. The capacitors in capacitor bank 420 are, for example, electrolytic capacitors. Capacitor bank 720 may alternatively be switched with a silicon controlled rectifier (SCR) switching device.

Capacitor bank 720 can be charged by capacitor-bank-charging power supply 710. Charges from capacitor bank 720 are then discharged into flashlamp 750 via IGBT-based switching device 730 while IGBT-based switching device 730 is being switched on-and-off repeatedly by frequency controller 740 during the discharge. Frequency controller 740 controls the gating of IGBT-based switching device 730 that, in turn, controls the switching frequency of the discharge. The repeated on-and-off switching of IGBT-based switching device 730 is intended to modulate the current flow from capacitor bank 720 to flashlamp 750, which in turn switches flashlamp 750 on and off. In other words, the frequency and pulse length of light pulses emitted by flashlamp 750 are dictated by frequency controller 740. By controlling the voltage and the pulse length of the light pulse, one can select the cavitation to occur at the particle-wafer surface interface and not on the wafer surface as a whole.

Flashlamp 750 can deliver a variable pulse length due to the fact that different particle sizes and types are released with differing difficulty. Thus, it is desirable to deliver the shortest pulse and highest intensity that will still remove the desired particles from the wafer surface.

As has been described, the present invention provides methods and apparatuses for removing particles on a semiconductor wafer. One advantage of this method is that it does not necessarily require the use of harsh or environmentally dangerous solvents.

The present invention becomes more effective as particles on a wafer become smaller. As particles become smaller, their radius of curvature increases. This further increases the discrimination (by lowering the power threshold) over the location where the nucleation of the gas bubbles will initiate over homogenous nucleation. That is, the high curvature of the gap between the small particles and the surface increases the likelihood of nucleation at that location over everywhere else, and it further increases the smaller the particles become. There is also a heating effect. When irradiated, smaller particles are heated at a greater rate, assuming similar absorption, than larger particles since the absorption of the light is proportional to the surface area of the particles. Additionally, the (thermal) mass of the particle is proportional to the mass of the particle. Thus, if a particle were a sphere of uniform density, the heating rate would be proportional to the surface area divided by the volume. This means that the heating rate of a particle scales as 1/r, where r is the radius of the particle. Thus, very small particles are heated at a much greater rate than larger ones as long as the heating rate is much greater than the leakage of heat from the particle to the surrounding environment. These two effects combined make a process that has automatic registration and is highly selective over other locations of the surface of a wafer.

While the invention has been particularly shown and described with reference to a preferred embodiment, it will be understood by those skilled in the art that various changes in form and detail may be made therein without departing from the spirit and scope of the invention.

What is claimed is:

1. An apparatus for removing particles from a surface of a semiconductor wafer, said apparatus comprising:
   an enclosure having a condensing environment;
   a spin coater for spinning said wafer contained within said enclosure having a condensing environment;
   a vapor diffuser for infusing a liquid vapor into said enclosure to allow some of said liquid vapor to be condensed onto a surface of said wafer on which particles may adhere while said wafer is being spun;
   a flashlamp for emitting a plurality of light pulses to said surface of said spinning wafer, each light pulse at an angular location across a radius of said spinning wafer after a predetermined amount of time has lapsed as determined by a charging rate of capacitors located within said flashlamp for delivering said each light pulse, until an entire surface of said spinning wafer has received at least one light pulse;
   an encoder to determine said angular position of said spinning wafer, and a number of rotations of said spinning wafer; and
   an electric grid for carrying said particles off said surface of said wafer.

2. The apparatus of claim 1, wherein said liquid vapor is acetone.

3. The apparatus of claim 1, wherein said liquid vapor is water.

4. The apparatus of claim 1, wherein said light pulses are emitted by said plurality of flashlamp at a stationary position, while said spinning wafer has to complete at least one rotation between two consecutive light pulses.

* * * * *